(12) United States Patent
Suzuki et al.

(10) Patent No.: US 12,261,183 B2
(45) Date of Patent: Mar. 25, 2025

(54) IMAGE PICKUP DEVICE AND METHOD FOR MANUFACTURING IMAGE PICKUP DEVICE

(71) Applicant: CANON KABUSHIKI KAISHA, Tokyo (JP)

(72) Inventors: Kentaro Suzuki, Kawasaki (JP); Shunsuke Nakatsuka, Kawasaki (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 18/148,341

(22) Filed: Dec. 29, 2022

(65) Prior Publication Data

US 2023/0136761 A1    May 4, 2023

Related U.S. Application Data

(60) Continuation of application No. 16/750,913, filed on Jan. 23, 2020, now Pat. No. 11,563,046, which is a (Continued)

(30) Foreign Application Priority Data

Sep. 11, 2015 (JP) ................................ 2015-180068

(51) Int. Cl.
*H01L 27/146* (2006.01)
*H04N 25/771* (2023.01)

(52) U.S. Cl.
CPC .. *H01L 27/14625* (2013.01); *H01L 27/14609* (2013.01); *H01L 27/1462* (2013.01);
(Continued)

(58) Field of Classification Search
CPC combination set(s) only.
See application file for complete search history.

(56) References Cited

U.S. PATENT DOCUMENTS 11,563,046 B2* 1/2023 Suzuki ............. H01L 27/14643
2009/0251582 A1* 10/2009 Oike ................. H01L 27/148
348/308

(Continued)

FOREIGN PATENT DOCUMENTS

| CN | 102637708 A | 8/2012 |
|----|-------------|--------|
| JP | 2002141490 A | 5/2002 |
| JP | 2015099888 A | 5/2015 |

*Primary Examiner* — Mark W Tornow
*Assistant Examiner* — Priya M Rampersaud
(74) *Attorney, Agent, or Firm* — Canon U.S.A., Inc. IP Division

(57) ABSTRACT

An image pickup device having a pixel region in which pixels are arranged, and in which a multilayer wiring structure is disposed. Each pixel includes a photoelectric conversion unit, a charge accumulation unit, a floating diffusion, a light shielding portion covering the charge accumulation unit and opening above the photoelectric conversion unit, and a waveguide which overlaps at least partially a portion at which the light shielding portion opens in a plan view. The device includes an insulating film disposed below the optical waveguide. The insulating film has a refractive index higher than that of an interlayer insulating film. The insulating film is disposed closer to the photoelectric conversion unit than to the lowermost wiring layer among wiring layers of the multilayer wiring structure. The insulating film extends to a portion above the light shielding portion. The insulating film is wider than a lower portion of the optical waveguide.

21 Claims, 11 Drawing Sheets

Related U.S. Application Data division of application No. 15/255,039, filed on Sep. 1, 2016, now abandoned.

(52) U.S. Cl.
CPC .. *H01L 27/14643* (2013.01); *H01L 27/14685* (2013.01); *H01L 27/14689* (2013.01); *H04N 25/771* (2023.01); *H01L 27/14623* (2013.01); *H01L 27/14627* (2013.01)

(56) References Cited

U.S. PATENT DOCUMENTS

| | | | | |
|---|---|---|---|---|
| 2011/0241089 A1* | 10/2011 | Ohri | .................... | H01L 27/1461 |
| | | | | 257/E31.085 |
| 2011/0242376 A1* | 10/2011 | Ando | ............... | H01L 27/14685 |
| | | | | 257/E31.127 |
| 2011/0242386 A1* | 10/2011 | Machida | ........... | H01L 27/14623 |
| | | | | 348/308 |
| 2012/0188431 A1* | 7/2012 | Takimoto | .......... | H01L 27/14843 |
| | | | | 257/233 |
| 2012/0199928 A1* | 8/2012 | Sawada | ............. | H01L 27/14687 |
| | | | | 257/E31.127 |
| 2013/0327924 A1* | 12/2013 | Machida | .............. | H04N 25/766 |
| | | | | 257/229 |
| 2014/0077283 A1* | 3/2014 | Lenchenkov | ..... | H01L 27/14629 |
| | | | | 257/292 |
| 2014/0084138 A1* | 3/2014 | Machida | ........... | H01L 27/14601 |
| | | | | 257/225 |
| 2015/0349013 A1* | 12/2015 | Shoyama | .......... | H01L 27/14643 |
| | | | | 257/292 |

\* cited by examiner

IMAGE PICKUP DEVICE AND METHOD FOR MANUFACTURING IMAGE PICKUP DEVICE

CROSS REFERENCE TO RELATED APPLICATIONS

The present application is a continuation of U.S. patent application Ser. No. 16/750,913, filed Jan. 23, 2020 which is a divisional of U.S. patent application Ser. No. 15/255,039, filed Sep. 1, 2016, entitled "IMAGE PICKUP DEVICE AND METHOD FOR MANUFACTURING IMAGE PICKUP DEVICE", the content of which is expressly incorporated by reference herein in its entirety. Further, the present divisional application claims priority from Japanese Patent Application No. 2015-180068 filed Sep. 11, 2015, which is also hereby incorporated by reference herein in its entirety.

BACKGROUND

Field

Aspects of the present invention generally relate to an image pickup device and, more particularly, to a configuration which includes an optical waveguide on a photoelectric conversion unit.

Description of the Related Art

A CMOS sensor in which a pixel includes an optical waveguide for guiding light to a photoelectric conversion unit and a charge accumulation unit for accumulating signal charge generated by the photoelectric conversion unit is proposed (see, for example, Japanese Patent Laid-Open No. 2013-168546). In an image pickup device disclosed in Japanese Patent Laid-Open No. 2013-168546, the charge accumulation unit is covered with a light shielding portion (a metal light shielding film) disposed above the charge accumulation unit via an insulating film. A lower surface of the light shielding portion, a lower surface of an optical waveguide, and an upper surface of the insulating film disposed above the charge accumulation unit coincide with one another. An antireflection film is disposed on an upper surface of the light shielding portion.

The technique disclosed in Japanese Patent Laid-Open No. 2013-168546 has the following two problems.

The first problem is that, in the configuration disclosed in Japanese Patent Laid-Open No. 2013-168546, light incident upon the optical waveguide can enter the charge accumulation unit via the insulating film below the light shielding portion. The light incident upon the charge accumulation unit may cause noise to signals in a previous accumulation period in the charge accumulation unit.

The second problem is related to a method for manufacturing the image pickup device disclosed in Japanese Patent Laid-Open No. 2013-168546. In Japanese Patent Laid-Open No. 2013-168546, an interlayer insulating film is etched to form an opening and a core material which becomes the optical waveguide is formed in the opening. The interlayer insulating film and the antireflection film are etched to form an opening using the light shielding portion as an etching stop film, and an opening is further formed by self alignment with respect to the opening of the interlayer insulating film and the antireflection film.

SUMMARY

In this manufacturing method, the photoelectric conversion unit is easily damaged and noise may be increased. Aspects of the present invention provide an imaging phase value of low noise.

According to an aspect of the present invention, an image pickup device which has a pixel region in which a plurality of pixels are arranged, and a multilayer wiring structure is disposed in a pixel region. Each of the pixels includes a photoelectric conversion unit, a charge accumulation unit configured to accumulate signal charge transferred from the photoelectric conversion unit, a floating diffusion to which the signal charge of the charge accumulation unit is transferred, a light shielding portion configured to cover the charge accumulation unit and opening above the photoelectric conversion unit, and an optical waveguide disposed above the photoelectric conversion unit. The device includes an insulating film disposed below the optical waveguide, wherein the insulating film has larger refractive index than interlayer insulating film of the multilayer wiring structure, the insulating film extends from below the optical waveguide to a portion above the light shielding portion at a portion closer to the photoelectric conversion unit than to the lowermost wiring layer among wiring layers of the multilayer wiring structure, and an area of the insulating film is larger than an emission surface area of the optical waveguide in a plan view.

Further features of aspects of the present invention will become apparent from the following description of exemplary embodiments with reference to the attached drawings.

DESCRIPTION OF THE EMBODIMENTS

Figure 11:
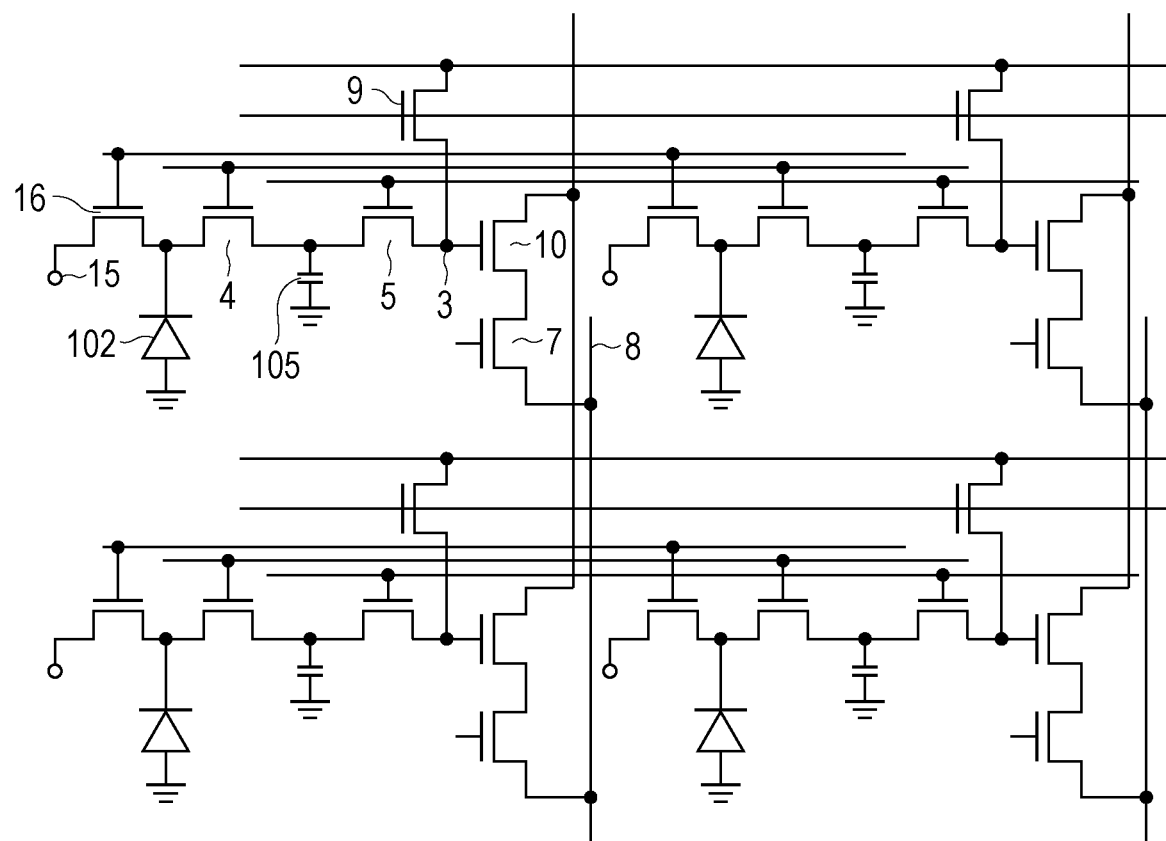
FIG. 11 is an equivalent circuit diagram of a pixel.

Embodiments of the present invention are described in detail with reference to Examples. Embodiments of the present invention are desirably applicable to a CMOS sensor. Embodiments of the present invention are also desirably applicable to an image pickup device in which a multilayer wiring structure is disposed in a pixel region in which a plurality of pixels are arranged. FIG. 11 is an equivalent circuit diagram of a pixel of the image pickup device of an embodiment of the present invention.

The pixel includes a photoelectric conversion unit 102, a charge accumulation unit 105, a floating diffusion unit (FD unit) 3, a signal line 8, and an overflow drain unit (OFD unit) 15. The pixel further includes a first transfer transistor 4, a second transfer transistor 5, a selection transistor 7, a reset transistor 9, a source follower transistor 10, and an OFD transistor 16 for the switching between connection/disconnection among the photoelectric conversion unit 102, the charge accumulation unit 105, the FD unit 3, the signal line 8, and the OFD unit 15 or the signal amplification. Each transistor is formed from, for example, a MOSFET and includes a gate electrode provided as a control electrode between drain and source.

The photoelectric conversion unit 102 is an element which generates signal charge in accordance with an amount of incident light. A photodiode may be used as the photoelectric conversion unit 102. The charge accumulation unit 105 is connected to the photoelectric conversion unit 102 via the first transfer transistor 4. The charge accumulation unit 105 functions as a grounding capacity and temporarily accumulates the charge transferred from the photoelectric conversion unit 102.

The FD unit 3 converts the charge transferred from the charge accumulation unit 105 into voltage signals. The FD unit 3 includes a semiconductor region disposed in a semiconductor substrate described later, and a FD capacitance designates a capacitance including parasitic capacitance produced in the node. The FD unit 3 is connected to the charge accumulation unit 105 via the second transfer transistor 5. The FD unit 3 is connected also to a source terminal of the reset transistor 9 and to a gate terminal of the source follower transistor 10. A power supply voltage is supplied to a drain terminal of the reset transistor 9. A voltage of the FD unit 3 is reset to the power supply voltage when the reset transistor 9 is turned on. At this time, a reset signal voltage is output to a source terminal of the source follower transistor 10.

When the second transfer transistor 5 is turned on and the charge is transferred to a FD from the charge accumulation unit 105, a pixel signal voltage corresponding to the transferred amount of charge is output to the source terminal of the source follower transistor 10.

The source terminal of the source follower transistor 10 is connected to a drain terminal of the selection transistor 7. The source terminal of the selection transistor 7 is connected to a vertical output line 8. When the selection transistor 7 is turned on, a reset signal or a pixel signal is output to the vertical output line 8. The signal is thus read out of the pixel.

The OFD unit 15 is further connected to the photoelectric conversion unit 102 via the OFD transistor 16. When the OFD transistor 16 is turned on, the charge accumulated in the photoelectric conversion unit 102 is discharged to the OFD unit 15. In all the pixels, the charge is discharged to the OFD units 15 simultaneously and then the accumulated charge is transferred to the charge accumulation units 105. In this manner, an electronic shutter which sets simultaneous and constant exposure time to all the pixels is implemented. The electronic shutter reduces time lag in the exposure timing caused by sequential reading of the charge from each pixel, whereby distortion of an image is avoided.

The equivalent circuit diagram illustrated in FIG. 11 is applicable to all the following examples.

Example 1

Figure 1:
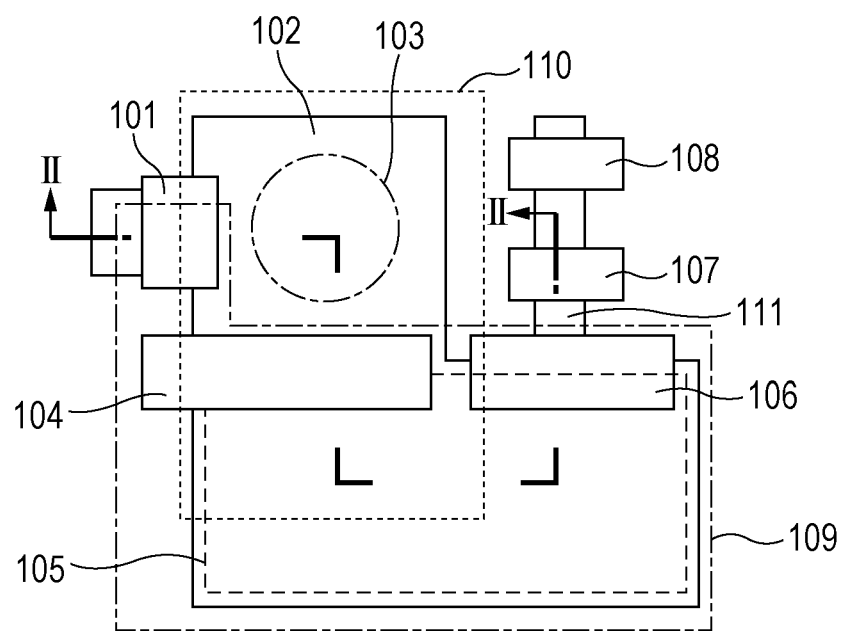
FIG. 1 is a plan view of a pixel.

FIG. 1 is a plan view of a pixel of Example 1. The same components are denoted by the same reference numerals through the drawings referred to in each Example below and FIG. 11.

A gate electrode 104 of the first transfer transistor 4 is disposed between the photoelectric conversion unit 102 and the charge accumulation unit 105. A gate electrode 106 of the second transfer transistor 5 is disposed between the charge accumulation unit 105 and the FD 111.

A gate electrode 107 of the reset transistor 9 is disposed adjacent to the FD 111. A drain region of the reset transistor 9 is disposed on the opposite side of the FD 111 via the gate electrode 107. The drain region of the reset transistor 9 is common to a drain region of the source follower transistor 10. A gate electrode 108 of the source follower transistor 10 is disposed adjacent to the drain region. A source region of the source follower transistor 10 is disposed on the opposite side of the drain region of the source follower transistor 10 via the gate electrode 108. The selection transistor 7 is not illustrated in FIG. 1. The selection transistor 7 may be disposed, for example, on the opposite side of the reset transistor 9 via the source follower transistor 10.

A gate electrode 101 of the OFD transistor 16 is disposed adjacent to the photoelectric conversion unit 102. The gate electrode 101 is disposed at a different portion on the side on which the gate electrode 104 of the photoelectric conversion unit 102 is disposed. A semiconductor region which constitutes a part of the OFD unit 15 is disposed on the opposite side of the photoelectric conversion unit 102 via the gate electrode 101. The semiconductor region becomes a drain region of the OFD transistor 16.

An optical waveguide 103 is disposed above the photoelectric conversion unit 102 so as to at least partially overlap the photoelectric conversion unit 102. Although the entire optical waveguide 103 is included in the photoelectric conversion unit 102 in a plan view in FIG. 1, it is only necessary that at least a part of the optical waveguide 103 overlaps the photoelectric conversion unit 102.

The light shielding portion 109 covers the charge accumulation unit 105, and opens above the photoelectric conversion unit 102. An insulating film 110 is disposed to cover the entire photoelectric conversion unit 102, a part of the charge accumulation unit 105, and a part of the gate electrodes 101 and 104. The insulating film 110 is described later. An element isolation region formed from an insulating material is disposed at portions other than those illustrated by the solid line. A part of the insulating film 110 overlaps the element isolation region.

Figure 2:
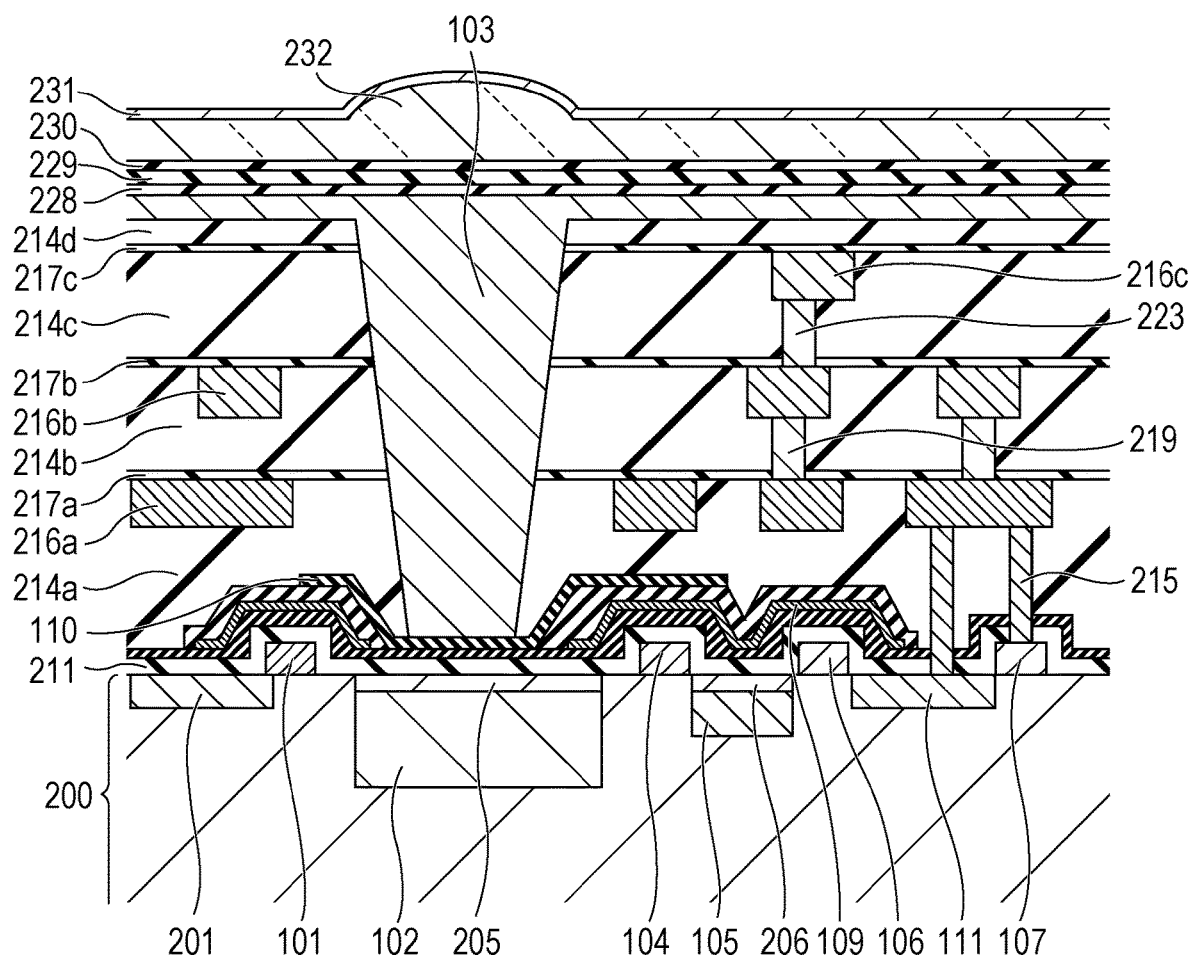
FIG. 2 is a cross-sectional view of Example 1 of the present invention.

FIG. 2 is a cross-sectional view along line II-II of FIG. 1. In FIG. 2, the photoelectric conversion unit 102 in a semiconductor substrate 200 is, for example, an n-type semiconductor region, in which a p-type semiconductor region 205 is disposed above the photoelectric conversion unit 102. Therefore, an embedded type photodiode structure is provided. With this configuration, noise generated on an interface between the semiconductor substrate 200 and the insulating film 110 disposed on the semiconductor substrate 200 can be reduced. The charge accumulation unit 105 is, for example, an n-type semiconductor region, and a p-type semiconductor region 206 is disposed above the charge accumulation unit 105. Therefore, an embedded type structure is provided. This structure can reduce noise.

An antireflection film 211 is disposed above the photoelectric conversion unit 102. A film having a refractive index between that of an interlayer insulating film 214 and that of the semiconductor substrate 200 may be used as the antireflection film 211. A silicon nitride film (SiN) of which refractive index is about 2.0 is used as the antireflection film 211.

The light shielding portion 109 is disposed to overlap a part of the photoelectric conversion unit 102 in a plan view, and opens at a portion which overlaps other part of the photoelectric conversion unit 102 in a plan view. The light shielding portion 109 is disposed to cover the charge accumulation unit 105 and at least a part of the gate electrode 104 of the transistor which transfers charge to the charge accumulation unit 105 from the photoelectric conversion unit 102. A portion of the light shielding portion 109 which overlaps the photoelectric conversion unit 102 includes a portion extended from a portion above the gate electrode 104 and a portion extended from a portion above the gate electrode 101. The light shielding portion 109 reduces light incident upon the charge accumulation unit 105, and reduces generation of charge by the incident light in the charge accumulation unit 105 and occurrence of noise.

The light shielding portion 109 is desirably formed from a material which hardly transmits visible light. For example, tungsten, tungsten silicide, tungsten oxide film, aluminum, or an alloy film thereof are used. A desirable film thickness d of the light shielding portion 109 is, for example, 100≤d≤200 nm. Since the light shielding portion 109 is formed on the gate electrode and other portions simultaneously, the light shielding portion 109 has unevenness caused by the film thickness of the gate electrode.

Wires 216a to 216c, a contact 215, and vias 219 and 223 are disposed above the semiconductor substrate 200. Although three wiring layers are illustrated in FIG. 2, a greater or smaller number of wiring layers may be provided. Although a plurality of wiring layers, interlayer insulating films, and diffusion preventing films are formed here, these layers and films will be described collectively with no alphabet added to the reference numerals if it is unnecessary to distinguish them. A diffusion preventing film 217 is used especially when the wire 216 is formed mainly from Cu.

The wire which constitutes each wire 216 may be formed from copper, aluminum, and an alloy film thereof. The wire 216 and the light shielding portion 109 may be connected with each other by the contact 215 to apply a voltage to the light shielding portion 109. Alternatively, a contact (not illustrated) may be formed between the light shielding portion 109 and the semiconductor substrate 200.

Diffusion preventing films 217a to 217c formed from a wiring material may be provided above the wires 216a to 216c. The diffusion preventing films 217a to 217c may be formed from, for example, a silicon nitride film (SiN) and a silicon carbide (SiC).

Each pixel further includes the optical waveguide 103 and an innerlayer lens 232 as an optical system disposed immediately above the photoelectric conversion unit 102. Although the optical waveguide 103 is round in a plan view, the optical waveguide 103 may be square, rectangular, ellipse, polygon, and the like. An unillustrated color filter and a microlens may be provided above the innerlayer lens 232.

The optical waveguide 103 has a function to condense the incident light on the photoelectric conversion unit 102. Since the amount of light incident upon the photoelectric conversion unit 102 is increased by the optical waveguide 103, sensitivity improves as compared with the case in which no optical waveguide 103 is provided. Sensitivity may decrease especially when an area of the photoelectric conversion unit 102 is small or when the F number of a lens of a camera is large if the image pickup device is used for the camera. This influence can be reduced by providing the optical waveguide 103.

Interlayer insulating films 214a to 214c are disposed between the wire 216. The interlayer insulating film 214 is desirably formed from a material having a refractive index lower than that of a material constituting the optical waveguide 103. For example, the interlayer insulating film 214 may be formed from a silicon oxide film (SiO) having a refractive index of about 1.5, and the optical waveguide 103 may be formed from a silicon oxynitride film (SiON) having a refractive index of about 1.8. The light incident obliquely at a predetermined angle upon each interface between the optical waveguide 103 and each of the insulating films 214a to 214c is totally reflected on each of the interfaces. Therefore, leakage of light incident upon the optical waveguide 103 into the interlayer insulating film 214 is reduced, and a greater amount of incident light reaches the photoelectric conversion unit 102. The materials of the interlayer insulating film 214 and the optical waveguide 103 are not limited to the combination of the silicon oxide film and the silicon oxynitride film. Any materials may be used in combination so that the refractive index of the optical waveguide 103 becomes higher than the refractive index of the interlayer insulating film 214. For example, the interlayer insulating film 214 may be a silicon oxide film and the optical waveguide 103 may be a silicon nitride film (SiN) having a refractive index of about 2.0. An organic film material and a material in which titanium oxide particles or the like are mixed in an organic film material may be used. The interlayer insulating films 214a to 214c may be laminated films of different materials. In that case, the refractive index of the optical waveguide 103 is set to be higher than the refractive indices of the interlayer insulating films 214a to 214c around the optical waveguide 103. The optical waveguide 103 has a descending taper shape in which an incident surface area is larger than an emission surface area. Therefore, it is possible to condense a greater amount of incident light on the photoelectric conversion unit 102 via the optical waveguide 103.

An antireflection film 228, an interlayer insulating film 229, and an antireflection film 230 are disposed between the optical waveguide 103 and the innerlayer lens 232. A silicon oxynitride film (SiON) having a refractive index of about 1.6 may be used, for example, as the antireflection films 228 and 230, and a silicon oxide film (SiO) having a refractive index of about 1.5 may be used as the interlayer insulating film 229. The interlayer insulating film 229 may be used as the interlayer insulating film in a peripheral circuit region.

An antireflection film 231 may further be formed above the innerlayer lens 232. This antireflection structure can increase transmittance of the incident light, thereby increasing sensitivity.

In Example 1, a multilayer wiring structure including the wire 216 and the interlayer insulating film 214 is disposed above the semiconductor substrate 200 in the pixel region. The optical waveguide 103 is desirably formed by embedding the above-described high refractive index member in an opening formed by penetrating each insulating film 214 of the multilayer wiring structure.

The insulating film 110 is provided to extend from below the optical waveguide 103 to reach a portion above the light shielding portion 109. The insulating film 110 includes a material having a refractive index higher than that of the interlayer insulating film 214. It is especially desirable that the insulating film 110 has a refractive index higher than the refractive index of a portion of the interlayer insulating film 214 disposed above the charge accumulation unit. This configuration prevents entrance of light leaked from the optical waveguide 103 into the charge accumulation unit 105. The reason thereof will be described below.

A case in which the insulating film 110 does not extend to a portion above the light shielding portion 109, that is, a case in which an end portion of the insulating film 110 faces an end portion of the light shielding portion 109 at substantially the same height in a cross-sectional view is considered. A part of the light incident upon the optical waveguide 103 propagates through the insulating film 110, and a part of the light leaks into the interlayer insulating film 214 above the charge holding portion at the end portion of the insulating film 110 and becomes stray light. The stray light enters the charge accumulation unit 105 through the insulating film between the light shielding portion 109 and the semiconductor substrate 200 and causes noise. If the insulating film 110 extends to a portion above the light shielding portion 109 as illustrated in FIG. 2, the light propagating from the optical waveguide 103 to the insulating film 110 reaches to a portion above the light shielding portion 109 along the insulating film 110. In this case, existence of the light shielding portion 109 prevents the light leaked from the end portion of the insulating film 110 from entering the charge accumulation unit 105. An area of the insulating film 110 is desirably larger than the emission surface area of the optical waveguide in a plan view.

Since the insulating film 110 extends to a portion above the light shielding portion 109, the light leaked from the optical waveguide 103 into the interlayer insulating film 214 and the light which did not enter an upper opening of the optical waveguide 103 can be condensed on the optical waveguide 103 through the insulating film 110 which has a refractive index higher than that of the interlayer insulating film 214. Also in this case, since the stray light in the interlayer insulating film 214 is reduced, entrance of light into the charge accumulation unit 105 can be reduced. The shape of the insulating film 110 in a plan view is not limited to that illustrated in FIG. 1 but may be various shapes.

Figure 3A:
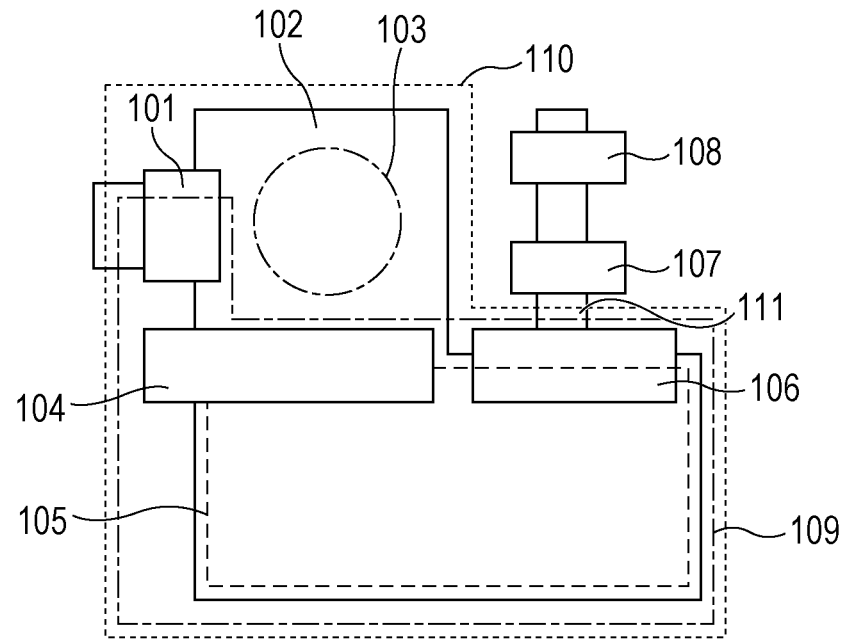
FIGS. 3A and 3B are plan views of a pixel of another example.

FIG. 3A illustrates a first another example of the shape of the insulating film 110 of Example 1. FIG. 3A differs from FIG. 1 in that the insulating film 110 covers the entire light shielding portion 109. In FIG. 1, a portion in which the insulating film 110 and the light shielding portion 109 are not laminated together in the vertical direction above the charge accumulation unit 105 exists, whereas the first another example has a laminated structure in which the insulating film 110 is located above the entire light shielding portion 109. In the laminated films, since reflection of the incident light from above generally occurs on the interfaces, transmittance of the incident light from above can be decreased. That is, in the first another example, as compared with the example illustrated in FIG. 2, a ratio of the stray light, among the stray light which does not enter the upper opening of the optical waveguide 103 but enters the interlayer insulating film 214, which penetrates the light shielding portion 109 and reaches the charge accumulation unit 105 can be decreased. Although FIG. 3A is a plan view of a unit pixel, the light shielding portion 109 and the insulating film 110 may be connected to those of adjacent pixels.

Figure 3B:
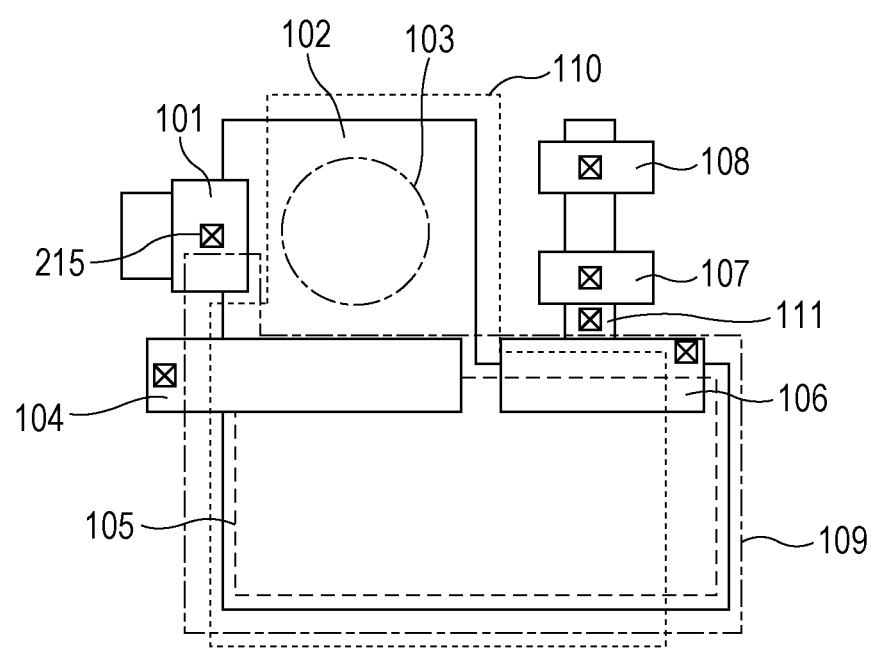

FIG. 3B illustrates a second another example of the insulating film 110 of Example 1. In FIG. 3B, the second another example differs from Example 1 of FIGS. 1 and 2 in that the insulating film 110 does not extend to a portion above the light shielding portion 109 on the gate electrode 101 of the OFD transistor 16. The second another example is suitable if the contact plug 215 does not overlap neither the light shielding portion 109 nor the insulating film 110 in a plan view for the reason of the manufacturing process. Also in the second another example, since the insulating film 110 extends to a portion above the light shielding portion 109 between the optical waveguide 103 and the charge accumulation unit 105, shielding performance against the charge accumulation unit 105 can be improved by the mechanism described above.

The effect of Example 1 is provided if the insulating film 110 extends to the portion above the light shielding portion 109 at least a part of the pixel, desirably between the optical waveguide 103 and the charge accumulation unit 105. At which portion the insulating film 110 extends to a portion above the light shielding portion 109 can be suitably designed in consideration of a pixel layout, desired pixel characteristics, and a manufacturing process.

Example 2

FIGS. 4A to 4C, 5A, 5B, 6A and 6B are cross-sectional views illustrating a method for manufacturing an image pickup device of Example 2.

Figure 4A:
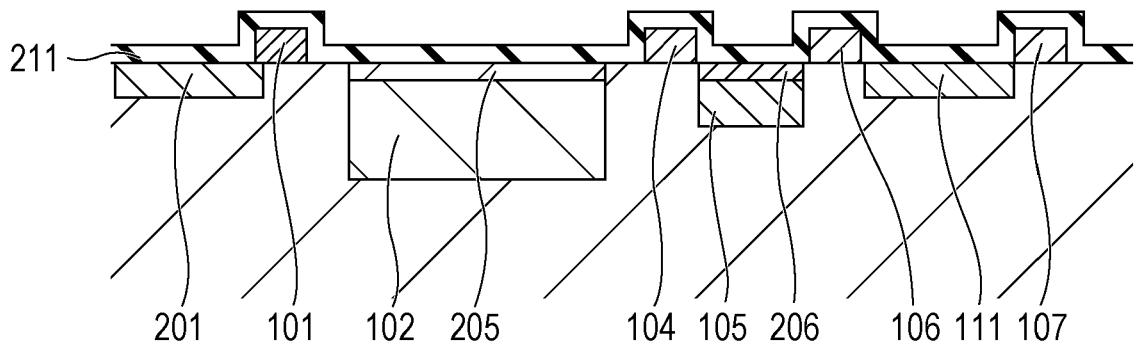
FIGS. 4A to 4C are cross-sectional views of a manufacturing method of Example 2.

In FIG. 4A, after preparing a semiconductor substrate, an OFD unit 201, a photoelectric conversion unit 102, a charge accumulation unit 105, a FD 111, and gate electrodes 101, 104, 106 and 107 of each transistor are formed.

Next, an antireflection film 211 is formed on the photoelectric conversion unit 102, a gate electrode of each transistor, and a source region and a drain region of each transistor. A silicon nitride film may be used as the antireflection film 211. The antireflection film 211 may be used as an unillustrated film for forming a side spacer of the transistor disposed in a peripheral circuit region outside a pixel region.

Figure 4B:
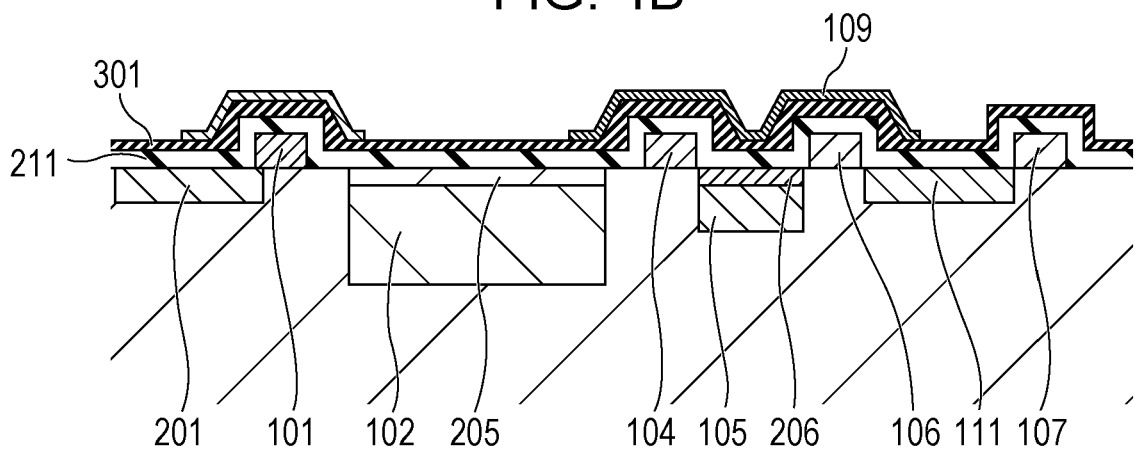

Next, as illustrated in FIG. 4B, an insulating film 301 is formed in the entire pixel region. On the insulating film 301, a shielding member which becomes a light shielding portion 109 is formed to cover at least the photoelectric conversion unit 102, the gate electrode 104, and the charge accumulation unit 105. A portion of the shielding member which overlaps the photoelectric conversion unit 102 in a plan view is removed so that the light shielding portion 109 which covers a part of the photoelectric conversion unit 102 and the charge accumulation unit 105 is formed. The insulating film 301 may be formed from a silicon oxide film. The shielding member may be removed by dry etching. Desirably, the insulating film 301 partially remains in the opening of the light shielding portion 109. This is because, if the insulating film 301 is removed completely, a part of the antireflection film 211 is also removed, whereby an antireflection effect can be decreased and sensitivity can be lowered.

Figure 4C:
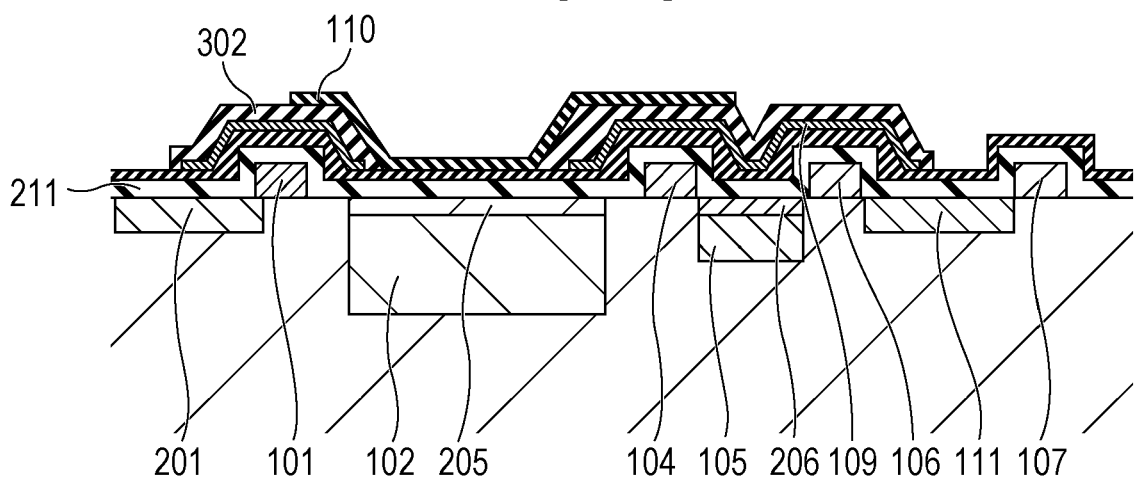

Next, as illustrated in FIG. 4C, an insulating film 302 is formed in the pixel region. Then, the insulating film 110 is formed in the opening of the light shielding portion 109 on the photoelectric conversion unit 102, on the gate electrode 104, and on at least a part of the charge accumulation unit 105. The shape of the insulating film 110 in a plan view is described later.

Patterning of the insulating film 110 may be performed by dry etching. In the region in which the insulating film 110 is removed, it is desirable to make the insulating film 302 partially remain. This is because, if the insulating film 302 is removed completely, a part of the light shielding portion 109 is also removed in the region in which the light shielding portion 109 is disposed below the insulating film 302.

Figure 5A:
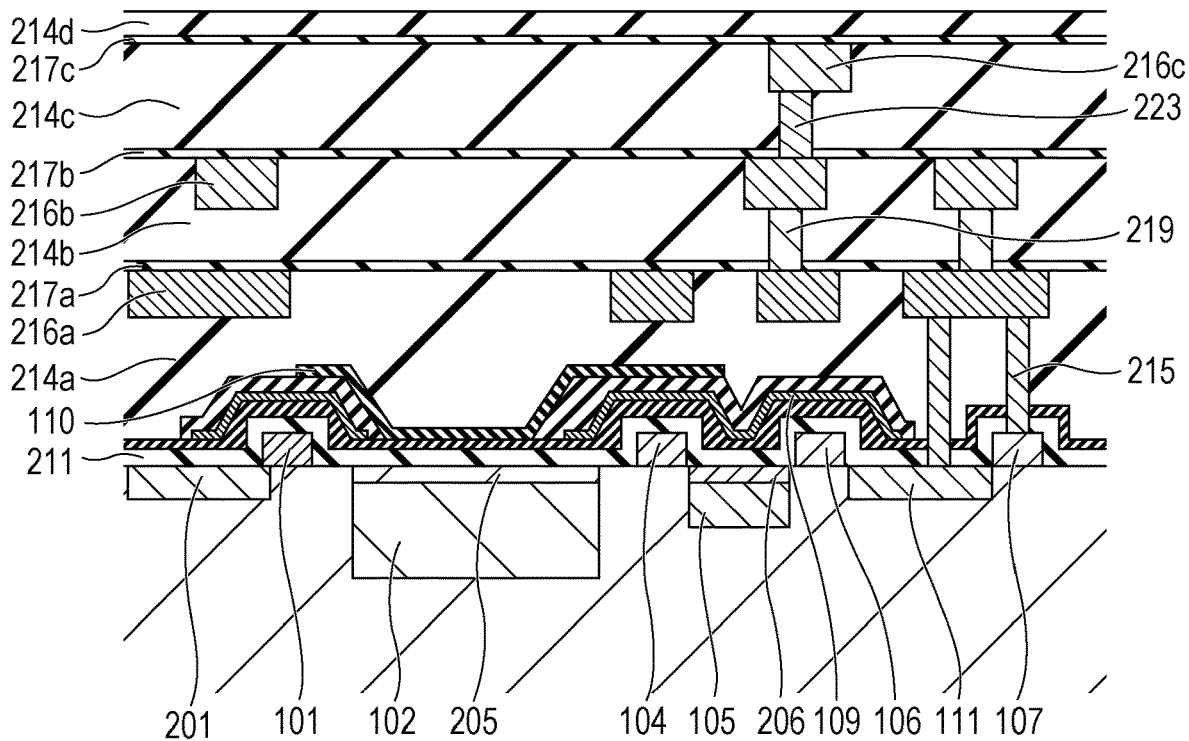
FIGS. 5A and 5B are cross-sectional views of the manufacturing method of Example 2.

Next, as illustrated in FIG. 5A, wires 216a to 216c, a contact plug 215, via plugs 219a and 219b, interlayer insulating films 214a to 214d, and diffusion preventing films 217a to 217c are formed by publicly known methods. Although three wiring layers are illustrated in FIG. 5A, a greater or smaller number of wiring layers may be provided. Although a plurality of wiring layers, interlayer insulating films, and diffusion preventing films are formed here, these layers and films will be described collectively with no alphabet added to the reference numerals if it is unnecessary to distinguish them. The diffusion preventing film 217 is not necessarily that used when the wire 216 is formed mainly from Cu.

Figure 5B:
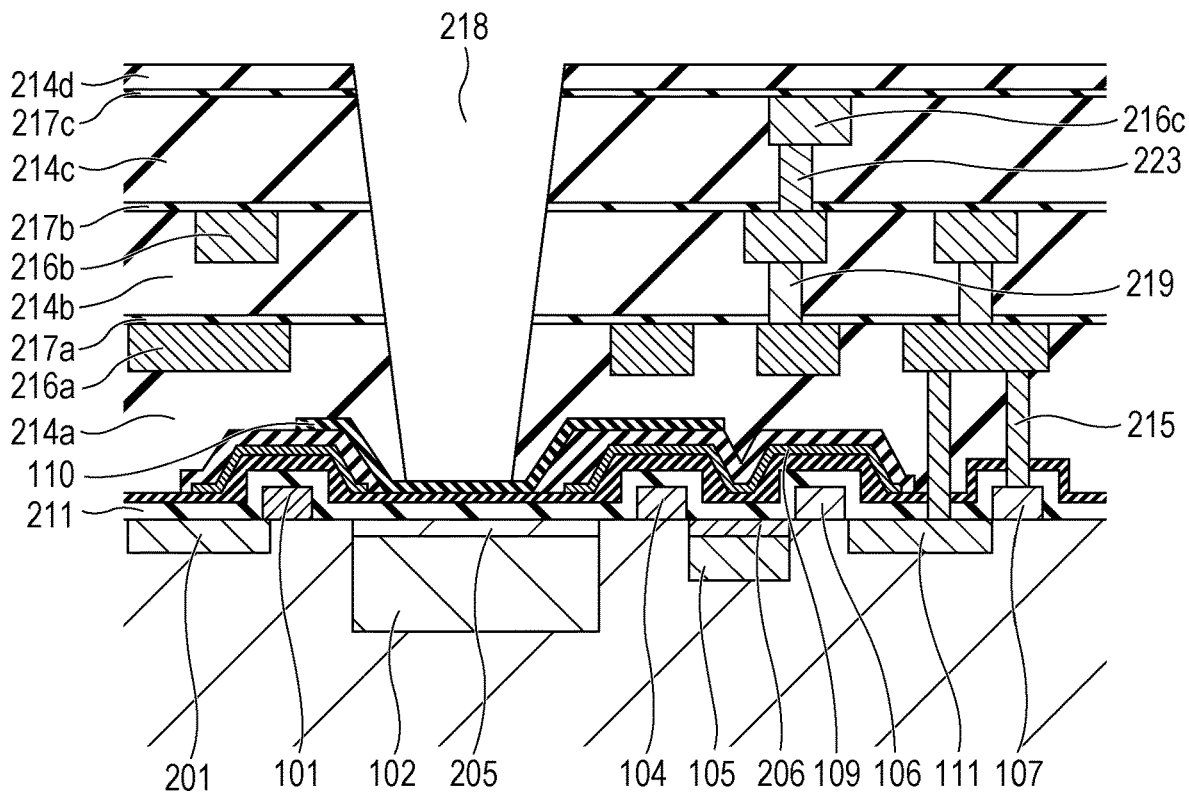

Then, as illustrated in FIG. 5B, an opening 218 is formed at a portion of the interlayer insulating film 214 and the diffusion preventing film 217 at which the optical waveguide is to be formed. The opening is formed by, for example, dry etching. During formation of the opening, the insulating film 110 functions as an etching stop film. Since etching is stopped by the insulating film 110, exposure of the photoelectric conversion unit 102 to the etching damage is reduced and an increase of noise is avoided. It is not necessary that etching is stopped completely by the insulating film 110. It is only necessary that the material is less easily etched than the interlayer insulating film 214 to the etching condition during etching of the interlayer insulating film 214. If the interlayer insulating film 214 is formed from a silicon oxide film or a glass-based material made mainly of silicon oxide, such as BPSG, PSG and NSG, the insulating film 110 may be formed from a film including a silicon nitride film and a silicon carbide film.

A part or the entire insulating film 110 may be removed by further etching.

Figure 6A:
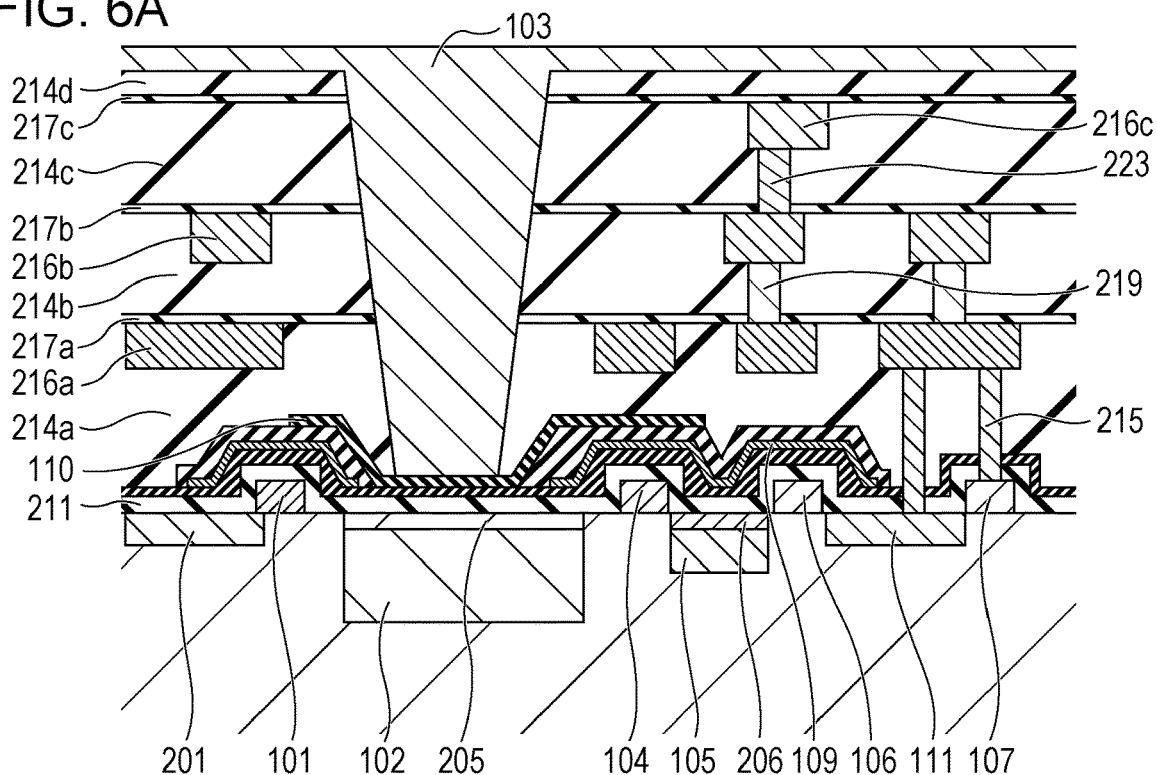
FIGS. 6A and 6B are cross-sectional views of the manufacturing method of Example 2.

Next, as illustrated in FIG. 6A, a high refractive index material having a refractive index higher than that of the interlayer insulating film 214 is embedded in the opening 208 to conduct planarization, and the optical waveguide 103 is formed. The high refractive index material may be embedded by, for example, high density plasma chemical vapor deposition or spin coating of an organic material. Planarization may be conducted by, for example, chemical mechanical polishing (CMP) or etch back.

Figure 6B:
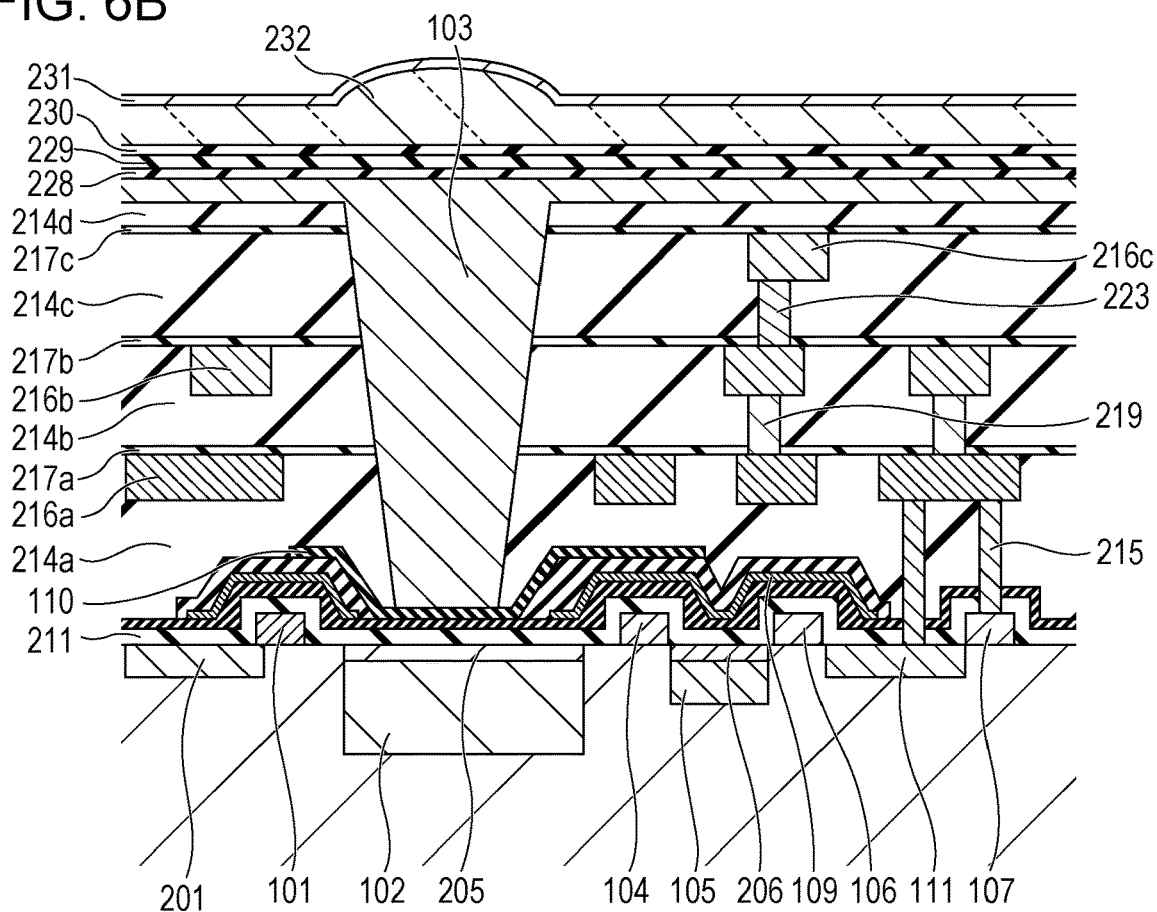

Next, as illustrated in FIG. 6B, an interlayer insulating film 229 and antireflection films 228 and 230 located on the upper and lower sides of the interlayer insulating film 229 are formed. A silicon oxide film may be used as the interlayer insulating film 229, and a silicon oxynitride film may be used as the antireflection film 228. As compared with a configuration in which the interlayer insulating film 229 is provided in contact with a member which constitutes the optical waveguide 103, the antireflection film 228 can increase the amount of light incident upon the photoelectric conversion unit 102.

As compared with a configuration in which a later-described innerlayer lens 232 and the insulating film 229 are disposed in contact with each other, the antireflection film 230 can increase the amount of light incident upon the photoelectric conversion unit 102.

The innerlayer lens 232 is formed above the antireflection film 230 and the antireflection film 231 is formed above the innerlayer lens 232.

As described above, in the manufacturing method of Example 2, the insulating film 110 which functions as the etching stop film is formed to extend continuously from at least a part of the photoelectric conversion unit 102 to at least a part of a portion above the light shielding portion in a plan view. This configuration prevents the light which leaks out of a side surface of the insulating film 110 from entering the semiconductor substrate 200 below the light shielding portion 109, and improves shielding performance of the charge accumulation unit 105.

As another effect, during formation of the opening 218 in the interlayer insulating film 214, the opening 218 can be formed wider on the side of the charge accumulation unit 105. This is because, even if the opening 218 is disposed to overlap the light shielding portion 109 in a plan view, the light shielding portion 109 is protected by the insulating film 110 during etching of the opening 218.

Example 3

Figure 7:
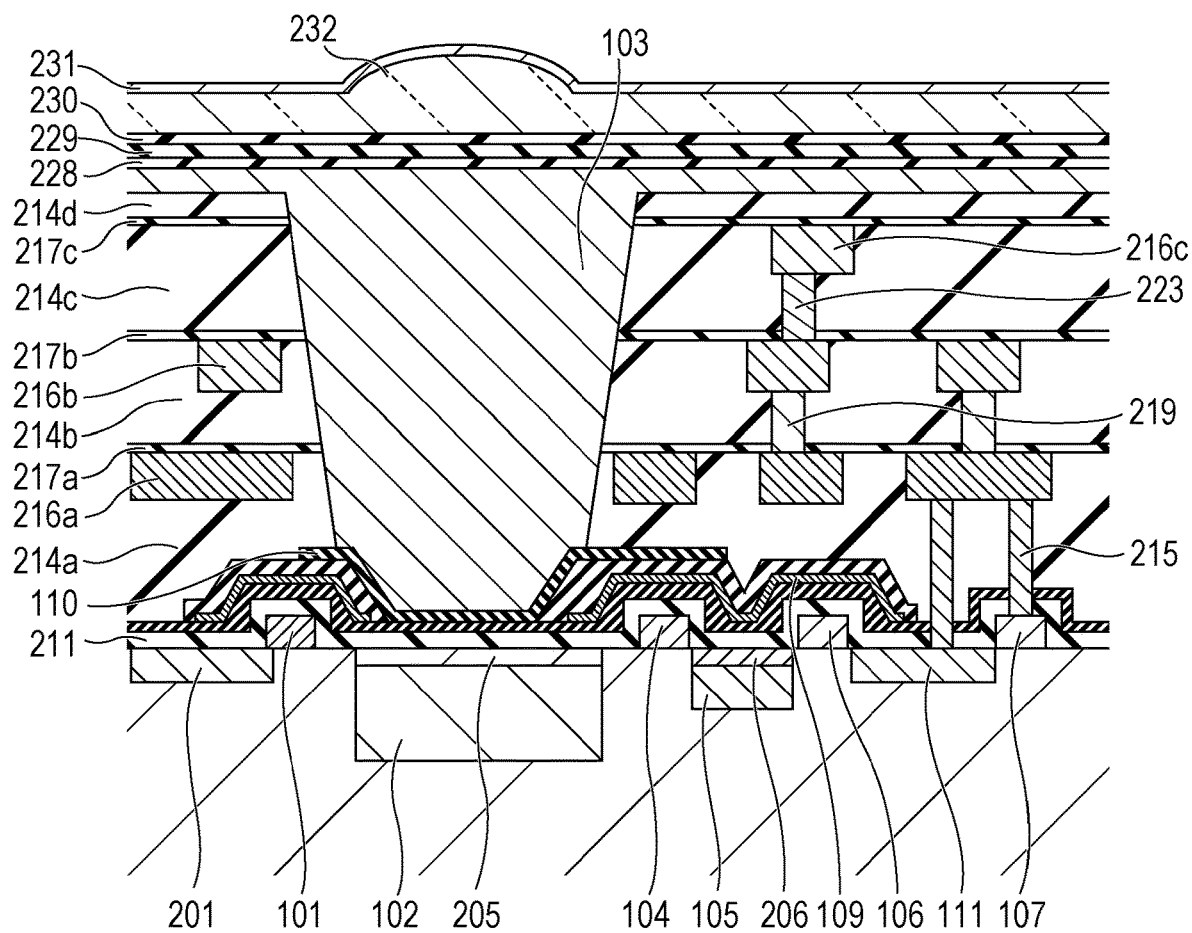
FIG. 7 is a cross-sectional view of an image pickup device of Example 3.

FIG. 7 is a cross-sectional view of an image pickup device of Example 3. The same components as those of Example 1 will be denoted by the same reference numerals and detailed description thereof will be omitted.

Example 3 differs from Examples 1 and 2 in the planar shape of the insulating film 110. In Example 3, an end portion of an optical waveguide 103 is located outside an opening portion of a light shielding portion 109. In Example 3, since the optical waveguide 103 has an emission surface and an incident surface wider than those of Examples 1 and 2, it is possible to condense a greater amount of light on a photoelectric conversion unit 102.

Also in the configuration illustrated in FIG. 7, since an insulating film 110 extends to a portion above the light shielding portion 109, light leaking on an interlayer insulating film 214 and light which did not enter an incident surface of the optical waveguide 103 are condensed on the optical waveguide 103 through the insulating film 110 of which refractive index is higher than that of the interlayer insulating film 214. Therefore, stray light in the interlayer insulating film 214 is reduced and noise generated in a charge accumulation unit 105 is reduced.

Example 4

Figure 8:
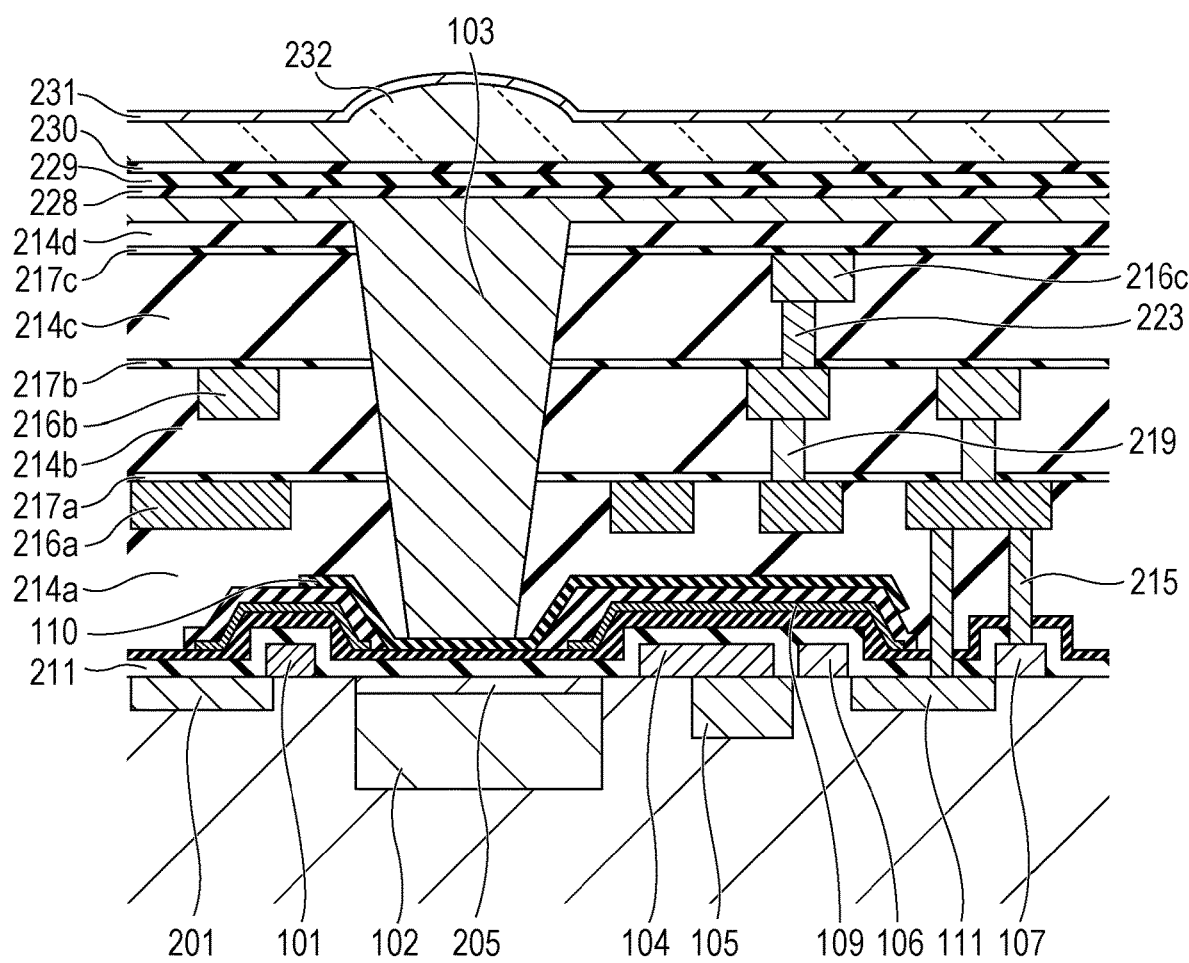
FIG. 8 is a cross-sectional view of an image pickup device of Example 4.

FIG. 8 is a cross-sectional view illustrating Example 4. In Example 4, as compared with Example 3, no p-type semiconductor region 205 exists above a charge accumulation unit 105 whereas a gate electrode 104 of a first transfer transistor extends to a portion above the charge accumulation unit 105.

In Example 4, noise generated near a surface of the semiconductor substrate 200 is reduced using a voltage applied to the gate electrode 104 in the charge accumulation unit 105. Since a volume of a p-type semiconductor portion of the silicon substrate surface can be reduced as compared with a case in which the p-type semiconductor region 205 is formed by ion implantation, it is possible to increase the number of electrons that can be accumulated in the charge accumulation unit 105.

Example 5

Figure 9:
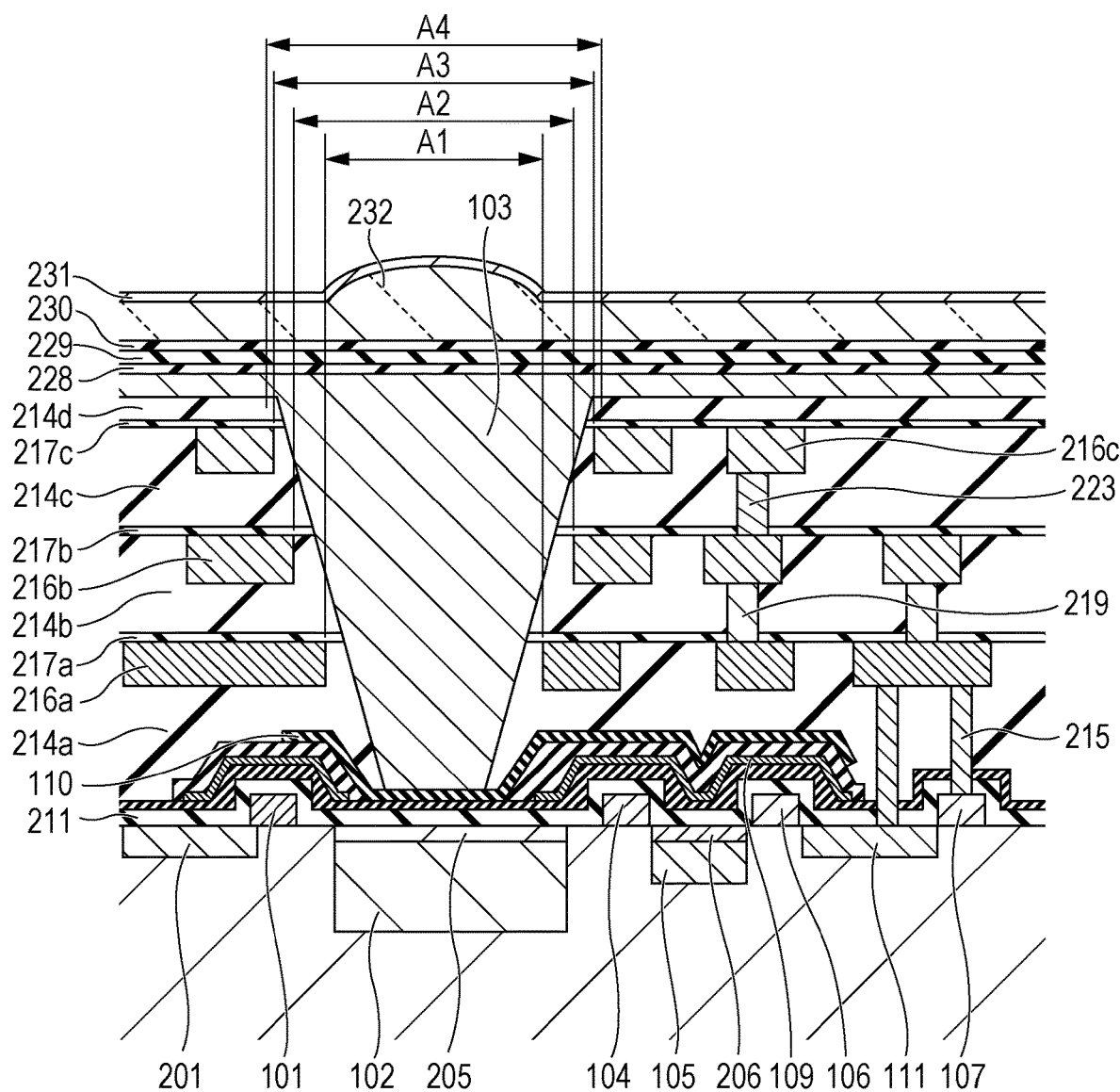
FIG. 9 is a cross-sectional view of an image pickup device of Example 5.

FIG. 9 is a cross-sectional view illustrating Example 5. Example 5 differs from Example 1 in that an opening region A4 above the optical waveguide 103 is larger than opening regions A1, A2 and A3 of wiring layers. In Examples of the present invention, since the charge accumulation unit 105 also exists in the semiconductor substrate 200 in addition to the photoelectric conversion unit 102, an area occupied by the photoelectric conversion unit 102 becomes relatively smaller. As in Example 5, by increasing the upper opening of the optical waveguide 103 greatly, it is possible to let a greater amount of light enter a photoelectric conversion unit 102 of relatively small area, thereby increasing sensitivity.

Example 6

Figure 10:
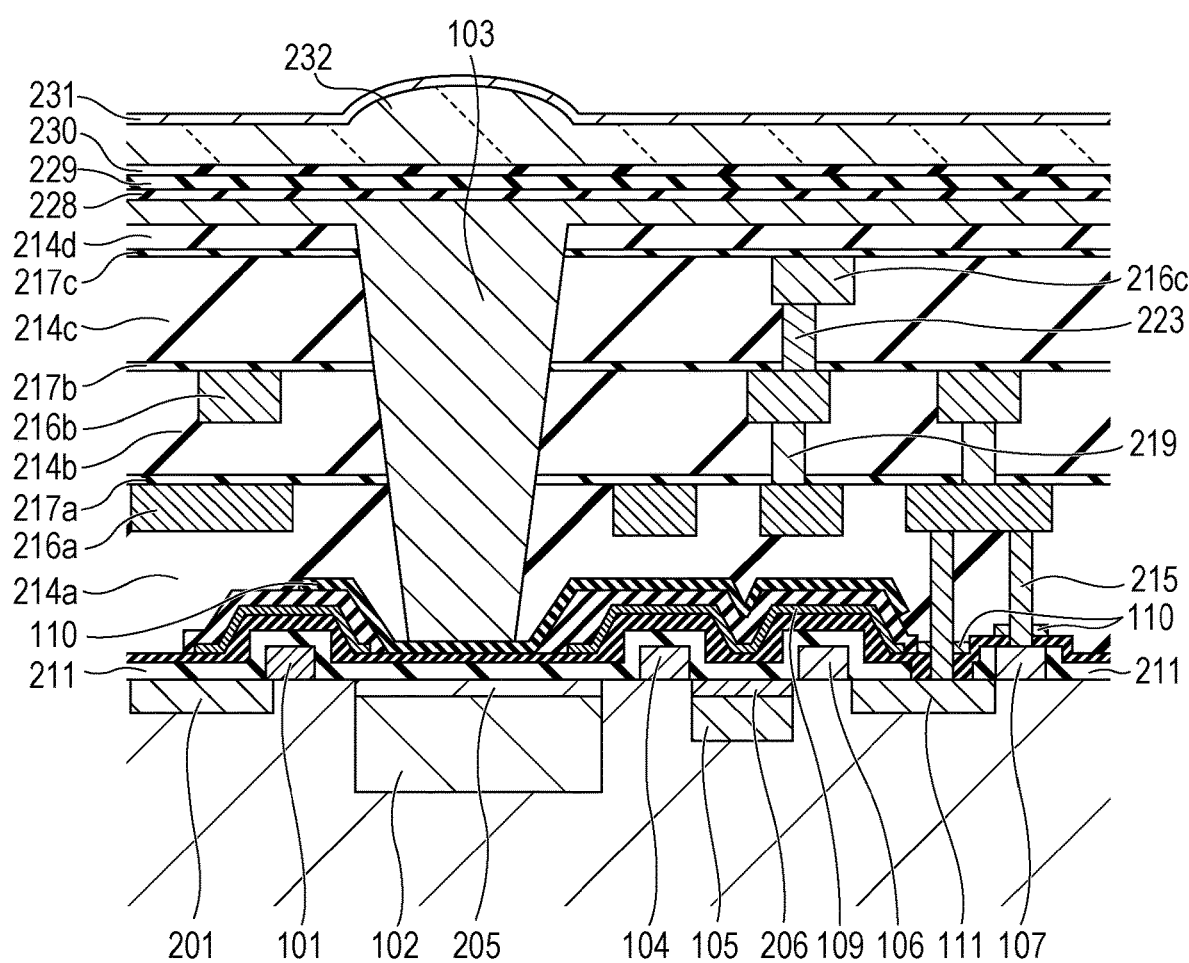
FIG. 10 is a cross-sectional view of an image pickup device of Example 6.

FIG. 10 is a cross-sectional view illustrating Example 6. In FIG. 10, as compared with Example 1, an antireflection film 211 opens at a location at which a contact 215 to a gate electrode 107 of a FD 111 and a source follower transistor is to be formed. Further, an insulating film 110 remains at a location at which the contact 215 is to be formed. The insulating film 110 is made to function as an etching stop film when the contact 215 is opened by dry etching.

The antireflection film 211 can reduce diffusion of hydrogen in a semiconductor substrate 200 during a hydrogen sinter process, whereas the antireflection film 211 can diffuse a greater amount of hydrogen in the semiconductor substrate 200 through the opening of the antireflection film 211 in Example 6. This increases an effect of terminating tangling bond which exists on the silicon substrate surface, and further reduces noise.

The location at which the opening of the antireflection film 211 is formed is not limited to the location at which the contact 215 to the gate electrode 107 of the FD 111 and the source follower transistor is to be formed. The opening of the antireflection film 211 may be formed at a location at which other contact (not illustrated) is to be formed. Regarding the contact to the FD 111 and the gate electrode 107 of an SF transistor, the antireflection film 211 may be left and used as an etching stop film.

Although the present invention is described with reference to Examples, combinations and changes may be made without departing from the concept of the invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A device including a semiconductor substrate and comprising:
   a photoelectric conversion unit,
   a charge accumulation unit,
   a floating diffusion unit,
   a drain unit,
   a first gate electrode disposed between the photoelectric conversion unit and the drain unit,
   a second gate electrode disposed between the photoelectric conversion unit and the charge accumulation unit,
   a third gate electrode disposed between the charge accumulation unit and the floating diffusion unit,
   an optical waveguide disposed above the photoelectric conversion unit and including a first portion,
   a light shielding portion arranged above at least a part of the second gate electrode and at least a part of the charge accumulation unit,
   a reset transistor including a fourth gate electrode, and
   a source follower transistor including a fifth gate electrode,
   wherein a length of the third gate electrode along a longitudinal direction of the third gate electrode is longer than at least one of a length of the fourth gate electrode along a longitudinal direction of the fourth gate electrode and a length of the fifth gate electrode along a longitudinal direction of the fifth gate electrode.

2. The device according to claim 1, further comprising a wiring layer, and
   a first insulating layer arranged between the wiring layer and the semiconductor substrate, and including a silicon oxide layer,
   wherein the first portion is arranged in an opening of the first insulating layer, and a material of the first portion is different from the silicon oxide layer.

3. The device according to claim 2,
   wherein the material includes a silicon nitride or a silicon carbide.

4. The device according to claim 1,
   wherein the light shielding portion is disposed above the first gate electrode and the third gate electrode.

5. The device according to claim 1, further comprising a second insulating film including a second portion disposed between the photoelectric conversion unit and the optical waveguide.

6. The device according to claim 5,
   wherein in planar view, the second insulating film and the light shielding portion are disposed in
   (i) at least a portion between the first gate electrode and the second gate electrode,
   (ii) at least a portion between the second gate electrode and the third gate electrode, or
   (iii) at least the portion between the first gate electrode and the second gate electrode, and at least the portion between the second gate electrode and the third gate electrode.

7. The device according to claim 5, wherein the second insulting film entirely covers the charge accumulation unit, in planar view.

8. The device according to claim 5, wherein a part of the second insulating film between the optical waveguide and the semiconductor substrate is thinner than other part of the second insulating film.

9. The device according to claim 5, further comprising a third insulating film between the second insulating film and the semiconductor substrate.

10. The device according to claim 1, wherein a film thickness of the light shielding portion is greater than or equal to 100 nm and smaller than or equal to 200 nm.

11. The device according to claim 10, wherein the light shielding portion contains tungsten.

12. The device according to claim 1, wherein the optical waveguide is disposed apart from an outer periphery of the light shielding portion.

13. The device according to claim 1, further comprising a wiring layer,
    wherein the light shielding portion is electrically connected to a wire of the wiring layer or to a part of the semiconductor substrate.

14. The device according to claim 1, wherein the second gate electrode extends above the charge accumulation unit.

15. The device according to claim 1, further comprising a lens disposed above the optical waveguide.

16. A camera comprising;
    the device according to claim 1, and
    a lens.

17. The device according to claim 1, wherein an area of the first gate electrode is smaller than an area of the second gate electrode.

18. The device according to claim 1, wherein a length of the first gate electrode along a longitudinal direction of the first gate electrode is shorter than the length of the third gate electrode along the longitudinal direction of the third gate electrode.

19. The device according to claim 1, wherein the length of the third gate electrode along the longitudinal direction of the third gate electrode is longer than the length of the fourth gate electrode along the longitudinal direction of the fourth gate electrode and the length of the fifth gate electrode along the longitudinal direction of the fifth gate electrode.

20. The device according to claim 1, wherein the first gate electrode, the photoelectric conversion unit and the fourth gate electrode are arranged in this order along a first direction being parallel to the longitudinal direction of the fifth gate electrode.

21. The device according to claim 1, wherein the third gate electrode, the fourth gate electrode and the fifth gate electrode are arranged in this order along a second direction being parallel to a longitudinal direction of the first gate electrode.

* * * * *